(12) United States Patent
Pomarede et al.

(10) Patent No.: US 7,476,627 B2
(45) Date of Patent: Jan. 13, 2009

(54) SURFACE PREPARATION PRIOR TO DEPOSITION

(75) Inventors: Christophe F. Pomarede, Phoenix, AZ (US); Jeff Roberts, Chandler, AZ (US); Eric J. Shero, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 296 days.

(21) Appl. No.: 11/431,037

(22) Filed: May 9, 2006

(65) Prior Publication Data

US 2006/0205230 A1 Sep. 14, 2006

Related U.S. Application Data

(63) Continuation of application No. 10/626,212, filed on Jul. 24, 2003, now Pat. No. 7,056,835, which is a continuation of application No. 09/944,734, filed on Aug. 31, 2001, now Pat. No. 6,613,695.

(60) Provisional application No. 60/283,584, filed on Apr. 13, 2001, provisional application No. 60/253,693, filed on Nov. 24, 2000.

(51) Int. Cl.
*H01L 21/31* (2006.01)
(52) U.S. Cl. .................. 438/767; 438/769; 438/775; 438/795; 257/E21.191; 257/E21.197
(58) Field of Classification Search .............. 438/767, 438/769, 775, 795
See application file for complete search history.

(56) References Cited

U.S. PATENT DOCUMENTS 2,394,930 A 2/1946 McRae (Continued)

FOREIGN PATENT DOCUMENTS

EP 0617481 A1 9/1994

(Continued)

OTHER PUBLICATIONS

Hoyas, Schuhmacher, Shamiryan, Waeterloos, Besling, Celis and Maex; Growth and Characterization of Atomic Layer Deposited $WC_{0.7}N_{0.3}$ on Polymer Films; Journal of Applied Physics; Jan. 1, 2004; 381-388; vol. 95, No. 1; American Institute of Physics; U.S.A.

(Continued)

*Primary Examiner*—Hsien-ming Lee
(74) *Attorney, Agent, or Firm*—Knobbe, Martens Olson & Bear LLP

(57) ABSTRACT

Methods are provided herein for treating substrate surfaces in preparation for subsequent nucleation-sensitive depositions (e.g., polysilicon or poly-SiGe) and adsorption-driven deposition (e.g. atomic layer deposition or ALD). Prior to depositing, the surface is treated with non-depositing plasma products. The treated surface more readily nucleates polysilicon and poly-SiGe (such as for a gate electrode), or more readily adsorbs ALD reactants (such as for a gate dielectric). The surface treatment provides surface moieties more readily susceptible to a subsequent deposition reaction, or more readily susceptible to further surface treatment prior to deposition. By changing the surface termination of the substrate with a low temperature radical treatment, subsequent deposition is advantageously facilitated without depositing a layer of any appreciable thickness and without significantly affecting the bulk properties of the underlying material. Preferably less than 10 Å of the bulk material incorporates the excited species, which can include fluorine, chlorine and particularly nitrogen excited species.

9 Claims, 5 Drawing Sheets

U.S. PATENT DOCUMENTS

| | | | |
|---|---|---|---|
| 3,895,127 | A | 7/1975 | Comizzoli |
| 4,056,642 | A | 11/1977 | Saxena et al. |
| 4,292,343 | A | 9/1981 | Plaettner et al. |
| 4,343,830 | A | 8/1982 | Sarma et al. |
| 4,436,761 | A | 3/1984 | Hayashi et al. |
| 4,544,571 | A | 10/1985 | Miller |
| 4,645,683 | A | 2/1987 | Gourrier et al. |
| 4,766,006 | A | 8/1988 | Gaczi |
| 5,135,775 | A | 8/1992 | Foller et al. |
| 5,281,546 | A | 1/1994 | Possin et al. |
| 5,576,071 | A | 11/1996 | Sandhu |
| 5,587,205 | A | 12/1996 | Saito et al. |
| 5,780,115 | A | 7/1998 | Park et al. |
| 5,939,763 | A | 8/1999 | Hao et al. |
| 5,950,107 | A | 9/1999 | Huff et al. |
| 5,990,013 | A | 11/1999 | Berenguer et al. |
| 5,993,916 | A | 11/1999 | Zhao et al. |
| 6,090,217 | A | 7/2000 | Kittle |
| 6,107,192 | A | 8/2000 | Subrahmanyan et al. |
| 6,124,158 | A | 9/2000 | Dautartas et al. |
| 6,200,866 | B1 | 3/2001 | Ma et al. |
| 6,296,715 | B1 | 10/2001 | Kittle |
| 6,297,539 | B1 | 10/2001 | Ma et al. |
| 6,503,330 | B1 | 10/2001 | Sneh et al. |
| 6,420,279 | B1 | 7/2002 | Ono et al. |
| 6,551,399 | B1 | 4/2003 | Sneh et al. |
| 6,573,181 | B1 * | 6/2003 | Srinivas et al. ............ 438/656 |
| 6,613,695 | B2 | 9/2003 | Pomarede et al. |
| 6,649,543 | B1 | 11/2003 | Moore |
| 6,727,148 | B1 | 4/2004 | Setton |
| 6,744,104 | B1 | 6/2004 | Aoki et al. |
| 6,800,830 | B2 | 10/2004 | Mahawili |
| 7,211,508 | B2 | 5/2007 | Chung et al. |
| 2003/0064607 | A1 | 4/2003 | Leu et al. |
| 2003/0232510 | A1 | 12/2003 | Buchanan et al. |
| 2004/0071878 | A1 | 4/2004 | Schuhmacher et al. |
| 2004/0121616 | A1 | 6/2004 | Satta et al. |
| 2004/0175928 | A1 | 9/2004 | Abell |

FOREIGN PATENT DOCUMENTS

| | | |
|---|---|---|
| JP | 60254621 A1 | 12/1985 |
| JP | 11/317461 | 11/1999 |
| JP | 2000160342 A2 | 6/2000 |
| WO | WO 00/01008 | 1/2000 |
| WO | WO 2004/064147 A2 | 7/2004 |
| WO | WO 2004/114398 A1 | 12/2004 |

OTHER PUBLICATIONS

Kim H-W et al: "In-situ low-temperature (600degreeC) wafer surface cleaning by electron cyclotron resonance hydrogen plasma for silicon homoepitaxial growth" Thin Solid Film, Elsevier-Sequoia S.A. Lausanne, Ch., vol. 289, No. 1, Nov. 30, 1996, pp. 192-198.

Ramm J. et al; "Low Temperature Epitaxial Growth by Molecular Beam Epitaxy on Hydrogen-Plasma-Cleaned Silicon Wafers" Thin Solid Fims, Elsevier-Sequoia S.A. Lausanne, Ch, vol. 246, No. 1/2, Jun. 15, 1994, pp. 158-163.

* cited by examiner

SURFACE PREPARATION PRIOR TO DEPOSITION

REFERENCE TO PRIORITY APPLICATIONS

This application is a continuation of U.S. patent application Ser. No. 10/626,212 (filed 24 Jul. 2003), now U.S. Pat. No. 7,056,835 which is a continuation of U.S. patent application Ser. No. 09/944,734 (filed 31 Aug. 2001; issued as U.S. Pat. No. 6,613,695), which claims the benefit of U.S. Provisional Patent Application 60/253,693 (filed 24 Nov. 2000) and U.S. Provisional Patent Application 60/283,584 (filed 13 Apr. 2001). The entire disclosure of all of these priority applications is hereby incorporated by reference herein.

FIELD OF THE INVENTION

The invention relates generally to surface preparation prior to film deposition for semiconductor fabrication, and are particularly to surface preparation to facilitate adsorption in subsequent atomic layer deposition (ALD) processes, or to facilitate nucleation of subsequent chemical vapor deposition processes.

BACKGROUND OF THE INVENTION

Integrated circuit design is constantly being scaled down in pursuit of faster circuit operation and lower power consumption. Scaled dimensions in a circuit design generally requires attendant changes in fabrication processing.

A basic building block of integrated circuits is the thin film transistor (TFT). As is known in the art, the transistor typically includes a gate electrode separated from a semiconductor layer or substrate by a thin gate dielectric material. Although a common acronym for state-of-the-art transistors is MOS, for metal-oxide-silicon, the material of choice for the gate electrode has long been silicon rather than metal. Among other advantages, silicon gate electrodes are able to withstand high temperature processes and enable self-aligned doping processes used for completing the transistor, thus saving expensive masking steps.

Accordingly, conventional gate electrodes are formed of polysilicon doped with conductivity-enhancing impurities, such as arsenic, phosphorus or boron. Silicon can be deposited by CVD with in situ doping by flowing a dopant source gas (e.g., arsine, phosphine, diborane, etc.) concurrently with a silicon source gas (e.g. silane).

Recently, interest has been drawn to the possibility of doping silicon electrodes with germanium, thereby reducing the electrical work function of the transistor gate electrode. Accordingly, a reduced voltage is needed to operate the circuit, consequently generating less heat. Moreover, a silicon germanium gate electrode remains compatible with surrounding materials and current integrated circuit fabrication processes. Proposals for flowing silicon germanium layers include in situ doping of a silicon layer by forming germane ($GeH_4$) along with silane ($SiH_4$) in a chemical vapor deposition (CVD) process.

While in situ doped CVD processes have been found to be effective in producing silicon germanium, the addition of germane to the silane flow has been found to significantly increase incubation or nucleation times over dielectric materials, particularly oxides such as silicon dioxide and some of the high-k materials discussed below. Similarly slow nucleation over dielectric materials occurs when chemical vapor depositing polysilicon, and is particularly acute when in situ flowing other dopant source gases.

Slow nucleation entails higher overall deposition times, lower throughput and consequently greater fabrication costs. The semiconductor industry is very sensitive to fabrication costs. Accordingly, any increase in wafer throughput, at any stage of processing, translates to reduced production costs and higher margins. Furthermore, the initial poor nucleation can lead to poor quality of the resultant layer, including problems with stoichiometry, density, surface planarity, etc.

One way in which SiGe or other in situ doped silicon deposition has been hastened is by the first formation of a nucleation layer, typically of polysilicon, over the gate dielectric, followed by poly-SiGe deposition. However, this additional step complicates the process flow and requires adjustment of the doping concentrations at the dielectric-electrode interface to ensure the desired work function for the transistor.

Another area in which process control is particularly critical is the fabrication of transistor gate dielectrics. In the pursuit of ever faster and more efficient circuits, semiconductor designs are continually scaled down with each product generation. Transistor switching time plays a large role in the pursuit of faster circuit operation. Switching time, in turn, can be reduced by reducing the channel length of the transistors. In order to realize maximum improvements in transistor performance, vertical dimensions should be scaled along with horizontal dimensions. Accordingly, effective gate dielectric thickness, junction depth, etc. will all decrease with future generation integrated circuits.

Conventional gate dielectrics are formed of high quality silicon dioxide and are typically referred to as "gate oxide" layers. Ultra thin gate oxides (e.g., less than 5 nm), however, have been found to exhibit high defect densities, including pinholes, charge trapping states, and susceptibility to hot carrier injection effects. Such high defect densities lead to leakage currents through the gate dielectric and rapid device breakdown unacceptable for circuit designs with less than 0.25 µm gate spacing, i.e., sub-quarter-micron technology.

While care under laboratory conditions can be used to control defect densities, such control has been difficult to achieve under commercial volume fabrication conditions. Moreover, even if the integrity of the oxide is perfectly maintained, quantum-mechanical effects set fundamental limits on the scaling of gate oxide. At high fields, direct tunneling dominates over Fowler-Nordheim tunneling, and largely determines oxide scaling limits. These scaling limits have been estimated at about 2 nm for logic circuits, and about 3 nm for more leakage-sensitive memory arrays in dynamic random access memory (DRAM) circuits. See, e.g., Hu et al., "Thin Gate Oxides Promise High Reliability," SEMICONDUCTOR INTERNATIONAL (July 1998), pp. 215-222.

Theoretically, incorporating materials of higher dielectric constant into the gate dielectric opens the door to further device scaling. Due to higher dielectric constant, many materials can exhibit the same capacitance as a thinner silicon dioxide layer, such that a lower equivalent oxide thickness can be achieved without tunnel-limited behavior. Silicon nitride ($Si_3N_4$), for example, has a higher dielectric constant than $SiO_2$ and also demonstrates good diffusion barrier properties, resisting boron penetration. More exotic materials with even higher dielectric constants, including aluminum oxide ($Al_2O_3$), zirconium oxide ($ZrO_2$), hafnium oxide ($HfO_2$), barium strontium titanate (BST), strontium bismuth tantalate (SBT), tantalum oxide ($Ta_2O_5$), etc., are also being investigated to allow further device scaling.

Similar high quality, thin dielectric layers are desirable in other contexts of integrated circuit fabrication. Integrated capacitors in memory arrays must exhibit a certain minimum capacitance for proper data storage and retrieval. Some efforts to increase capacitance for a given memory cell space have focused on the use of materials characterized by high dielectric constants (high k materials), such as those listed above.

As noted above, it is often difficult to deposit electrode materials, such as polysilicon, amorphous silicon, and particularly doped silicon or silicon germanium alloys, over conventional silicon oxides as well as many of the high k materials currently under investigation. Many other types of materials and deposition techniques in integrated circuit fabrication face issues that depend upon the substrate surface upon which the material is to be deposited.

Intermediate layers are often deposited prior to deposition of the desired functional layer for a variety of remedial reasons, including otherwise poor adhesion, nucleation, electrical interface properties, diffusion, etc. Such intermediate layers add to the complexity and cost of fabrication, and can also occupy valuable space within high aspect ratio features, such as contact vias or folded structures for high surface area capacitors. In some contexts, like gate dielectrics and capacitor dielectrics, additional layers increase the overall dielectric thickness and reduce the effectiveness of the layer, contrary to the trend for scaling down integrated circuits.

Accordingly, a need exists for improving the speed, efficiency, quality and uniformity of depositing layers in semiconductor fabrication.

SUMMARY OF THE INVENTION

In satisfaction of this need, methods are provided herein for treating substrate surfaces in preparation for subsequent deposition. In particular, the methods are provided for preceding nucleation sensitive depositions (e.g., polysilicon or poly-SiGe) and adsorption driven deposition (e.g. atomic layer deposition or ALD).

Prior to depositing, the preferred embodiments treat the surface with plasma products. Advantageously, CVD polysilicon and poly-SiGe more readily nucleates over the treated surface, or ALD reactants more readily adsorb upon the treated surface. The surface treatment provides surface moieties more readily susceptible to a subsequent deposition reaction, or more readily susceptible to further surface treatment prior to deposition. By changing the surface termination of the substrate with a low temperature radical treatment, subsequent deposition is advantageously facilitated without depositing a layer of any appreciable thickness and without significantly affecting the bulk properties of the underlying material.

Exemplary plasma product treatment includes provision of F, Cl, H or N radicals, particularly through a remote plasma module attached to a deposition chamber for in situ surface treatment prior to deposition.

BRIEF DESCRIPTION OF THE DRAWINGS

These and other aspects of the invention will be readily apparent from the following description and from the appended drawings, which are meant to illustrate and not to limit the invention, and wherein.

DETAILED DESCRIPTION OF THE PREFERRED EMBODIMENT

Figure 1:
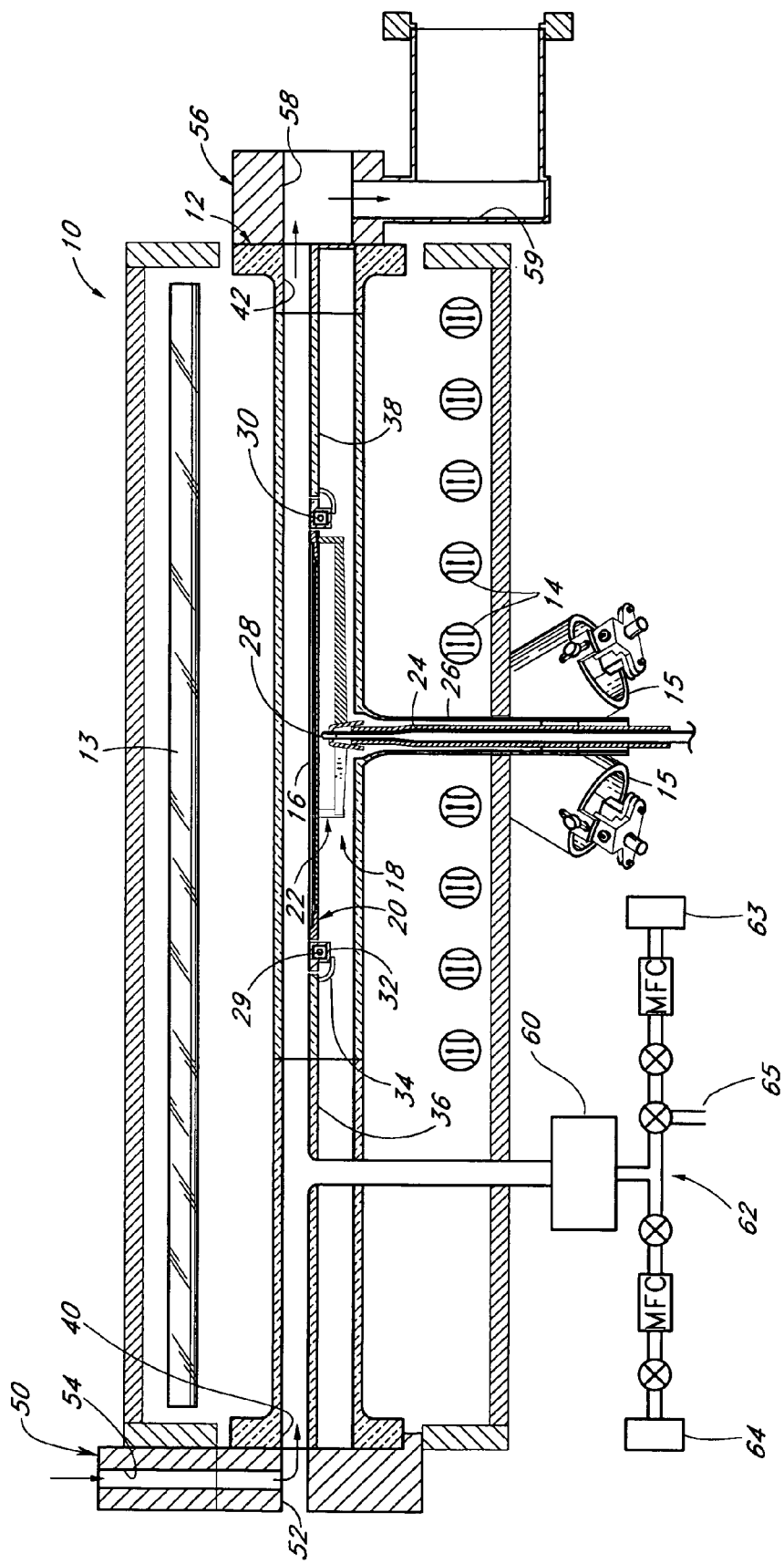
FIG. 1 is a schematic sectional view of an exemplary single-substrate reaction chamber.

The skilled artisan will readily appreciate that the principles disclosed herein will have application to a variety of contexts in which interface preparation prior to deposition is desired. Such preparation is particularly advantageous for nucleation-sensitive and adsorption-driven processes.

In accordance with the preferred embodiments, the invention provides treatment of surfaces with plasma products prior to deposition. The plasma products preferably modify surface termination to make them susceptible to subsequent deposition As noted in the Background section above, many deposition processes are sensitive to the surface over which deposition is required. Doped polysilicon and polycrystalline silicon-germanium alloy (poly-SiGe) tend to nucleate poorly over silicon oxide, as is well known in the art, and also over newer high-k materials now being investigated. The present invention provides a method for preparing the dielectric surface for electrode deposition thereover, advantageously without significant deposition and preferably without significant modification of bulk properties of the dielectric.

Another deposition technique facilitated by the methods of the preferred embodiments is atomic layer deposition (ALD). ALD is a self-limiting process, whereby alternated pulses of reaction precursors saturate a substrate and leave no more than one monolayer of material per pulse. The precursors are selected to ensure self-saturating reactions, because an adsorbed layer in one pulse leaves a surface termination that is non-reactive with the gas phase reactants of the same pulse. A subsequent pulse of different reactants do react with the previous termination to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B. V. 1994, the disclosures of which are incorporated herein by reference.

Unfortunately, depending upon the chemistries employed, ALD does not deposit equally well on different starting substrates. Some ALD process recipes, for example, have been found slow or even non-operative in depositing over silicon, and particularly etched or cleaned silicon surfaces (typically hydrogen-terminated). For example, it is unlikely that aluminum alkyls, such as $(CH_3)_3Al$, can attach on a hydrogen-terminated silicon surface in ALD processes for depositing $Al_2O_3$.

However, a first water pulse may react with the silicon surface and leave a hydroxyl terminated (—OH) or oxygen bridged (Si—O—Si) silicon surface that serves as a starting surface for the chemisorption of aluminum alkyls. The ALD process can proceed thereafter, as the preferred precursors readily react with $SiO_2$ to deposit $Al_2O_3$ thereover.

Prior to describing the processes in greater detail, the preferred reactor for depositing polysilicon and poly-SiGe by CVD is first described below. While not illustrated separately, the ALD processes described below are more preferably performed in a Pulsar™ 2000 ALCVD™ Reactor, commercially available from ASM Microchemistry Oy of Espoo, Finland, which can also be modified to have a remote plasma processing unit connected thereto.

Preferred Reactor

While the preferred embodiments are presented in the context of a single-substrate, horizontal flow cold-wall reactor, it will be understood that certain aspects of the invention will have application to reactors of other types. The illustrated single-pass horizontal flow design enables laminar flow of reactant gases, with low residence times, which in turn facilitates sequential processing while minimizing reactant interaction with each other and with chamber surfaces. Thus, among other advantages, such a laminar flow enables sequentially flowing reactants that might react with each other. Reactions to be avoided include highly exothermic or explosive reactions, such as produced by oxygen and hydrogen-bearing reactants, and reactions that produce particulate contamination of the chamber. The skilled artisan will recognize, however, that for certain sequential processes, other reactor designs can also be provided for achieving these ends, provided sufficient purge time is allowed to remove incompatible reactants.

FIG. 1 shows a chemical vapor deposition (CVD) reactor 10, including a quartz process or reaction chamber 12, constructed in accordance with a preferred embodiment, and for which the methods disclosed herein have particular utility. While originally designed to optimize epitaxial deposition of silicon on a single substrate at a time, the inventors have found the superior processing control to have utility in CVD of a number of different materials. Moreover, the illustrated reactor 10 can safely and cleanly accomplish multiple treatment steps sequentially in the same chamber 12. The basic configuration of the reactor 10 is available commercially under the trade name Epsilon® from ASM America, Inc. of Phoenix, Ariz.

A plurality of radiant heat sources are supported outside the chamber 12 to provide heat energy in the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, the principles and advantages described herein apply equally well to depositing layers over numerous other types of substrates, including, without limitation, glass substrates such as those employed in flat panel displays.

The illustrated support structure 18 includes a substrate holder 20, upon which the wafer 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and one or more side thermocouples (not shown). Each of the peripheral thermocouples are housed within a slip ring 32, which surrounds the substrate holder 20 and the wafer 16. Each of the central and peripheral thermocouples are connected to a PID temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and the outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully with respect to FIG. 2, and communicates such gases with the slot 52 and the inlet port 40. The inlet 54 can include gas injectors as described in U.S. Pat. No. 5,221,556, issued Hawkins et al., or as described with respect to FIGS. 21-26 in U.S. Pat. No. 6,093,252, issued Jul. 25, 2000, the disclosures of which are hereby incorporated by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

The preferred reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the excited species generator 60 and thence into the reaction chamber 12.

It will be understood that, in other arrangements, the excited species can be generated within the process chamber. For example, in situ plasmas can be generated by applying radio frequency (RF) power to spaced electrodes within the process chamber, as is known in the art. Exemplary in situ plasma CVD reactors are available, for example, from ASM Japan K. K. of Tokyo, Japan under the trade name Eagle™ 10 or Eagle™ 12. Furthermore, energy can be coupled to source gases by a number of means, including by induction, capacitively, etc., for either in situ or remote plasma generation. Preferably, however, a remote plasma source is employed for the processes described herein, affording greater control for surface modification with minimal bulk effects.

Wafers are preferably passed from a handling chamber (not shown), which is isolated from the surrounding environment, through the slot 52 by a pick-up device. The handling chamber and the processing chamber 12 are preferably separated by a gate valve (not shown) of the type disclosed in U.S. Pat. No. 4,828,224, the disclosure of which is hereby incorporated herein by reference.

The total volume capacity of a single-wafer process chamber 12 designed for processing 200 mm wafers, for example, is preferably less than about 30 liters, more preferably less than about 20 liters, and most preferably less than about 10 liters. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

Figure 2:
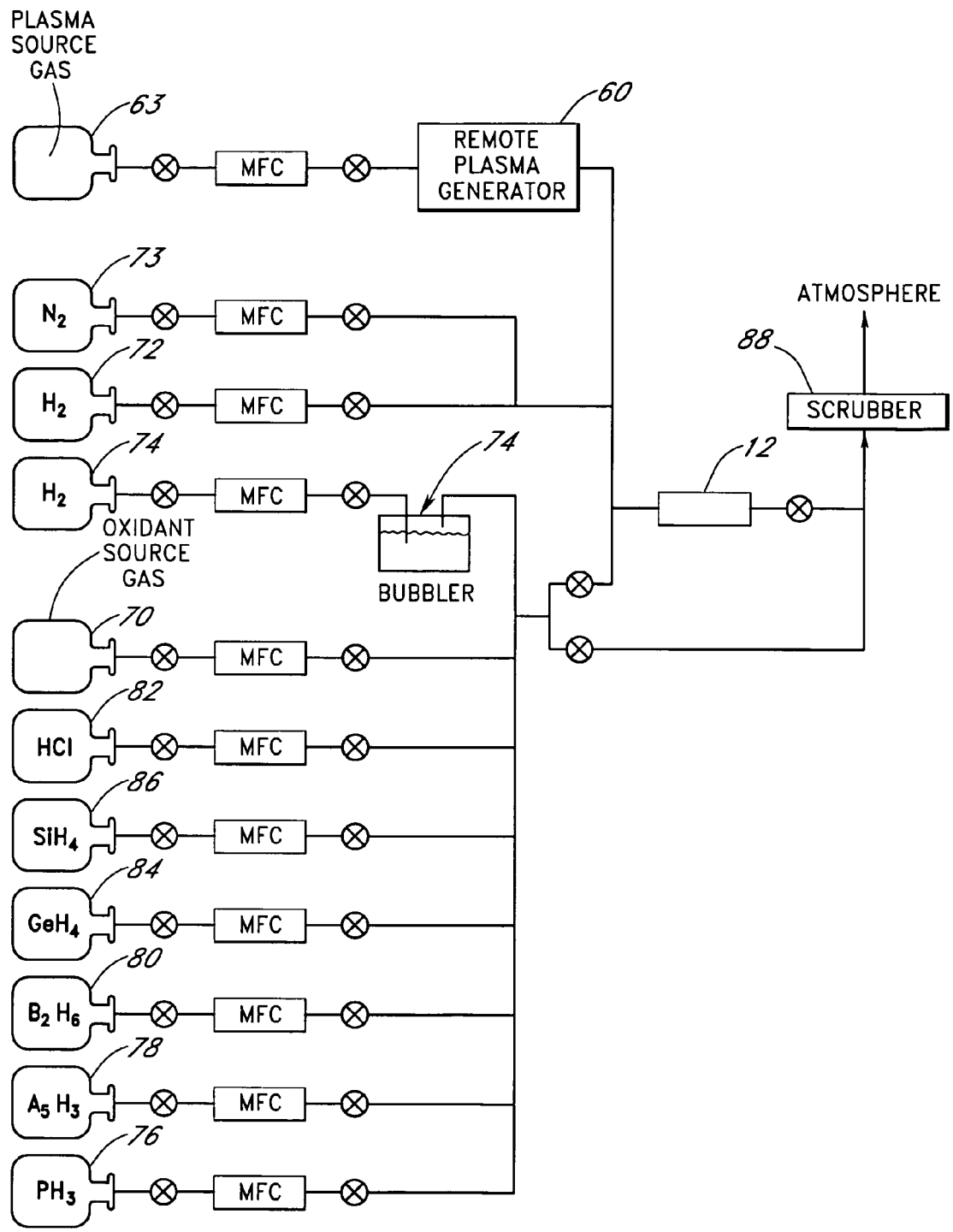
FIG. 2 is a gas flow schematic, illustrating reactant and purge gas sources in accordance with a preferred embodiment of the present invention.

FIG. 2 shows a gas line schematic, in accordance with the preferred embodiment. The reactor 10 is provided with a source 70 of oxidizing agent or oxidant. The oxidant source 70 can comprise any of a number of known oxidants, particularly a volatile oxidant such as $O_2$, $O_3$, NO, $H_2O$, $N_2O$, HCOOH, $HClO_3$. Preferably, the oxidant is introduced in an inert carrier gas flow, such as $N_2$. In other arrangements, pure reactant flows can also be used. In still other arrangements, an oxygen-containing source gas can be provided to the remote plasma generator 60 to provide excited species for oxidation.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition. $H_2$ can also be employed in a high temperature hydrogen bake to sublimate native oxide prior to layer formation. $H_2$ can also flow through the excited species generator 60 to generate H radicals for native oxide cleaning or for other purposes.

The preferred reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

A liquid reactant source 74 is also shown. The liquid source 74 can comprise, for example, liquid dichlorosilane (DCS), trichlorosilane (TCS) or higher order silane sources in a bubbler, and a gas line for bubbling and carrying vapor phase reactants from the bubbler to the reaction chamber 12. The bubbler can alternatively (or additionally) hold liquid $Ta(OC_2H_5)_5$ as a metal source, while a gas line serves to bubble $H_2$, $N_2$, Ne, He or Ar through the liquid metal source and transport metallorganic precursors to the reaction chamber 12 in gaseous form.

Desirably, the reactor 10 will also include other source gases such as dopant sources (e.g., the illustrated phosphine 76, arsine 78 and diborane 80 sources) and etchants for cleaning the reactor walls and other internal components (e.g., HCl source 82 or $NF_3/Cl_2$ provided as the plasma source gas 63 for feeding the excited species generator 60). For deposition of poly-SiGe in accordance with the preferred embodiments, a source of germanium 84 (e.g., germane or $GeH_4$) is also provided for doping or formation of SiGe films.

Additional source gases include an ammonia ($NH_3$) source (not shown), which serves as a volatile nitrogen source, useful in CVD and nitridation anneal steps. A silicon source 86 is also provided, illustrated as monosilane ($SiH_4$). As is known in the art, silanes, including monosilane ($SiH_4$), disilane ($Si_2H_6$), trisilane ($Si_3H_8$), DCS and TCS, are volatile silicon sources for CVD applications, such as the deposition of poly- SiGe, silicon nitride, metal silicides, and extrinsic or intrinsic silicon (polycrystalline, amorphous or epitaxial, depending upon deposition parameters). Monosilane ($SiH_4$), as illustrated, is particularly preferred to avoid chlorine incorporation into sensitive gate dielectric structures.

Each of the gas sources may be connected to the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 to condense environmentally dangerous fumes before exhausting to the atmosphere.

In addition to the conventional gas sources and liquid bubblers, discussed above, the preferred reactor 10 includes the excited species source 60 positioned remotely or upstream of the reaction chamber 12. The illustrated source 60 couples microwave energy to gas flowing in an applicator, where the gas includes reactant precursors from the reactant source 63. For the processes described below, the plasma source gases 63 include a source of fluorine (e.g., $NF_3$, $F_2$ or $B_2F_6$), a source of chlorine (e.g., $Cl_2$) and/or a source of nitrogen (e.g., $N_2$ or $NH_3$). Other useful plasma source gases for the preferred processes include $H_2$, $O_2$, NO, $N_2O$, He, and Ar. A plasma is ignited within the applicator, and excited species are carried toward the chamber 12. Preferably, of the excited species generated by the source 60, overly reactive ionic species substantially recombine prior to entry into the chamber 12. On the other hand, radicals such as F, Cl, N or O survive to enter the chamber 12 and react as appropriate. As will be clear from the general process discussion below, remote plasma-generated excited species facilitate higher quality layers as well as possible greater wafer throughput.

Process Flow

Figure 3:
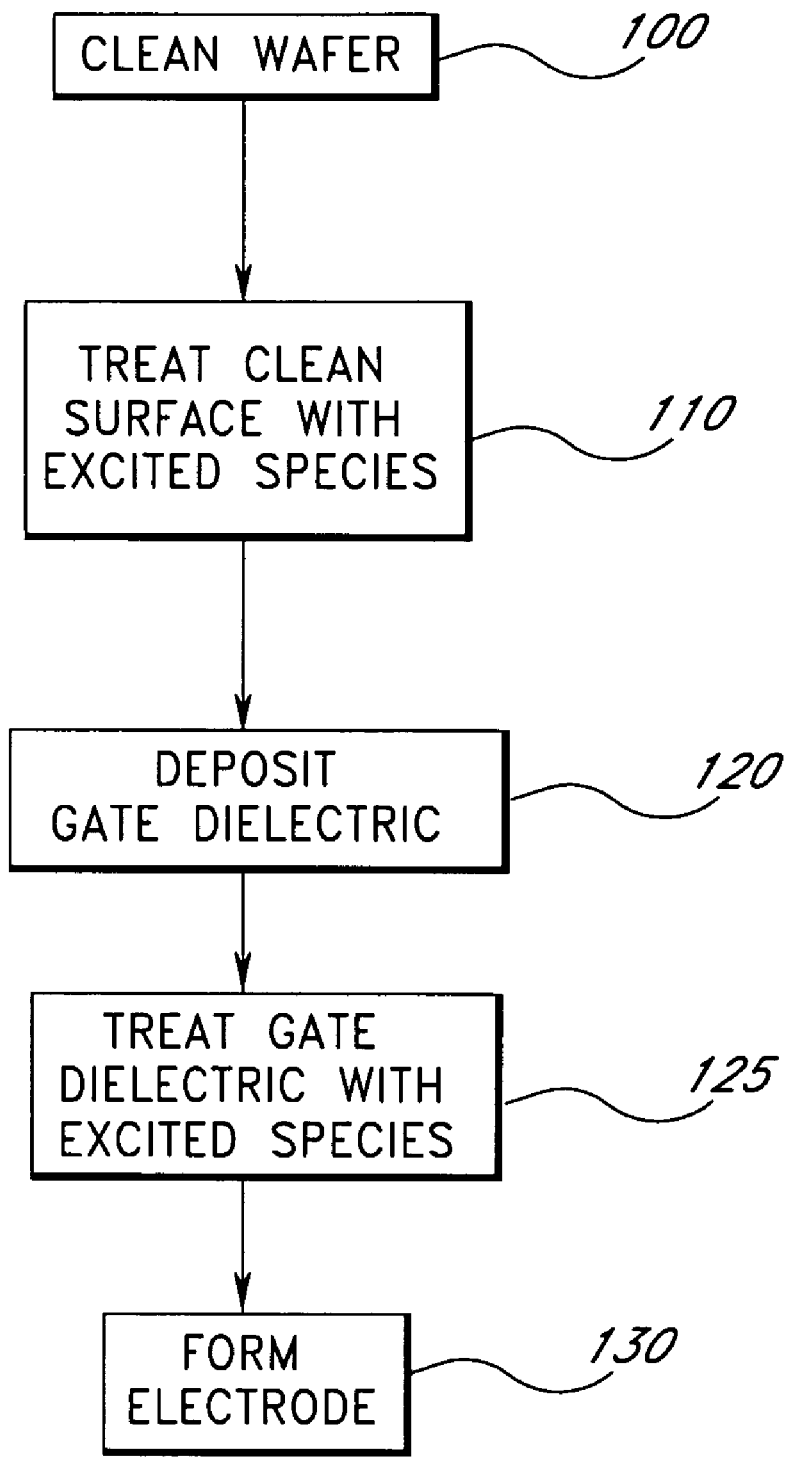
FIG. 3 is a flow chart generally showing steps for treating substrates in accordance with the preferred embodiments.

FIG. 3 shows a general process sequence in accordance with the invention, illustrated in the context of forming a transistor gate stack on a semiconductor substrate. As illustrated, a single substrate, including a semiconductor structure, is first cleaned 100 to remove contaminants and naturally occurring or native oxide on the semiconductor structure. The semiconductor structure can comprise, among other things, an epitaxial silicon layer or the top surface of a monolithic silicon layer. Conventionally, wafer cleaning prior to gate oxide growth is conducted ex situ prior to loading the wafer into the process chamber. For example, wafers may be cleaned in an SC1/HF wet etch bath. Alternatively, an integrated HF and acetic acid vapor clean can be conducted in a neighboring module within a cluster tool, reducing transport time and opportunity for recontamination or reoxidation. For some applications, the cleaning oxide left by the SC1 step is not removed, but is instead used as the initial oxide layer. In another possibility, a hydrogen bake step can be conducted within the chamber 12 to sublimate native oxide. Small amounts of HCl vapor can be added to this step to aid in cleaning metal contaminants and the like during the hydrogen bake. In still another arrangement, plasma products can assist or conduct in situ cleaning, such as by substituting H radicals for hydrogen gas.

Either after ex situ cleaning, or prior to in situ cleaning, the wafer or other substrate is loaded into the process chamber. Cleaning 100 of native oxide tends to leave a hydrogen-terminated surface, which advantageously inhibits spontaneous reoxidation upon exposure to the clean room environment or other source of oxidants. Unfortunately, such hydrogen termination can also inhibit subsequent ALD processes, such as the illustrated ALD deposition of $ZrO_2$ or $Al_2O_3$. One method of facilitating adsorption of reactants is to deposit a thin interfacial layer. Disadvantageously, however, such a layer increases the overall thickness of the dielectric to be formed upon the substrate and also tends to decrease the effective dielectric constant.

Accordingly, the preferred embodiments employ an excited species treatment 110 of the cleaned substrate surface, preferably conducted in the same chamber as a subsequent deposition 120 of the gate dielectric. The treatment modifies the surface termination of the substrate to promote subsequent deposition. Advantageously, the treatment 110 is tuned such that the excited species impart sufficient activation energy to break the surface bonds (in the illustrated embodiment, of hydrogen-silicon bonds and Si—Si bonds) and form new ones, while temperature is maintained low enough to prevent etching of the substrate or significant diffusion of active species into the bulk material. Additionally, no appreciable deposition takes place. At the most, a monolayer of terminating tails is left by the excited species treatment 110. As discussed below, while no deposition beyond surface termination takes place, some conversion of the top few monolayers of the substrate can be advantageous.

The excited species treatment can be conducted in situ in the same chamber as a subsequent dielectric deposition 120. In this case, the substrate temperature is preferably set to match that desired for the subsequent deposition 120 within the same chamber.

In one embodiment, the excited species treatment 110 includes exposure to fluorine or chlorine radicals in sufficient supply to break surface bonds, but insufficient to etch the preferred silicon surface. Sources gases provided to the preferred remote plasma generator 60 (FIG. 2) include $NF_3$, $F_2$, $B_2F_6$, $Cl_2$, $CF_4$, etc. Argon, helium or other inert gas can also flow to aid formation of glow discharge and serve as carrier gas, but the total flow rates and partial pressures are preferably arranged to keep reaction chamber pressure below about 10 Torr for maintaining operation of the remote plasma unit. Preferably, the process parameters are tuned to be sufficient for breaking surface bonds without significant bulk modification. In the illustrated embodiments, wherein subsequent deposition 120 is conducted in situ by ALD, temperatures are preferably in the range of room temperature to 700° C., more preferably from 200° C. to 500° C. For the given temperature, pressure, remote plasma power, reaction times and reactant concentrations are adjusted to achieve the desired surface conditioning.

In another embodiment, a nitrogen source, such as ammonia ($NH_3$) or nitrogen gas ($N_2$) can be supplied to the substrate to break surface bonds and create Si—N bonds, depending on the nature of the subsequent deposition. Argon, helium or other inert gas can also flow to aid formation of glow discharge and serve as carrier gas, but the total flow rates are partial pressures are preferably arranged to keep reaction chamber pressure below about 10 Torr for maintaining operation of the remote plasma unit. As noted, the process does not result in a deposited layer. Process parameters are preferably selected to replace Si—Si bonds in the upper few monolayers of the substrate with Si—N bonds, particularly converting less than about 10 Å of the substrate surface to silicon oxynitride, more preferably forming about 2 Å to 5 Å on average. Process parameters are set to avoid significant nitrogen diffusion into the bulk, beyond the nitrogen incorporation in the upper few monolayers of the substrate. Preferably, the bulk substrate contains less than about 1% atomic concentration of nitrogen. As noted with respect to F or Cl treatment, the excited species treatment 110 can be conducted in situ with subsequent high k dielectric formation 120, such that the same temperature range as the subsequent deposition can be employed for the excited species treatment 110. For the given temperature, pressure, remote plasma power, process duration and reactant concentrations can be adjusted to for the desired limitations on nitrogen penetration into the bulk.

Following excited species treatment 110, the gate dielectric is deposited 120 over the treated surface. The deposition 120 can also include radical species flow; however, in such a case, the radical supply from the excited species treatment 110 will typically be different from the supply employed in the deposition 120. Accordingly, the flow of radicals from the excited species treatment 110 is preferably stopped prior to deposition 120.

In accordance with the preferred embodiment, the deposition 120 comprises an ALD-type deposition, wherein alternated pulses saturate the surface, and each cycle leaves no more than about 1 monolayer of the dielectric material. In the examples below, an aluminum source gas or zirconium source gas is alternated with an oxygen source gas to form aluminum oxide ($Al_2O_3$) and zirconium oxide ($ZrO_2$). The skilled artisan will appreciate that similar recipes can be employed other high k materials, such as hafnium oxide ($HfO_2$), tantalum oxide ($Ta_2O_5$), barium strontium titanate (BST) or strontium bismuth tantalate (SBT).

The first pulse of the ALD deposition advantageously reacts with the termination left by the excited species surface treatment 110. Alternatively, a further surface treatment can be provided prior to the deposition. For example, a water treatment can more readily react with the surface after the excited species treatment 110, to leave a hydroxyl-terminated surface that readily react with subsequent ALD processes.

In one embodiment, either before or after the excited species treatment 110, the silicon wafer was loaded into the reaction space of Pulsar™ 2000 reactor (commercially available from ASM Microchemistry of Espoo, Finland), which is designed for ALD processes. The reaction space was evacuated to vacuum with a mechanical vacuum pump. After evacuation the pressure of the reaction space was adjusted to about 5-10 mbar (absolute) with flowing inert gas (e.g., helium, argon or nitrogen gas) that had a purity of 99.9999%. Then the reaction space was stabilized at 300° C. Alternating vapor phase pulses of $(CH_3)_3Al$ and $H_2O$, vaporized from external sources, were introduced into the reaction space and contacted with the substrate surface. The source chemical pulses were separated from each other with flowing nitrogen gas.

Each pulsing cycle consists of four basic steps:
$(CH_3)_3Al$ pulse
$N_2$ purge
$H_2O$ pulse
$N_2$ purge An exemplary aluminum oxide deposition cycle is summarized in Table I.

TABLE I $Al_2O_3$

| Phase | Reactant | Temperature (° C.) | Pressure (mbar) | Time (sec) |
|---|---|---|---|---|
| pulse 1 | TMA | 300 | 5-10 | 0.2 |
| purge 1 | — | 300 | 5-10 | 1.1 |
| pulse 2 | $H_2O$ | 300 | 5-10 | 1.5 |
| purge 2 | — | 300 | 5-10 | 3.0 |

The number of cycles determine the thickness of the layer. The growth rate of $Al_2O_3$ from $(CH_3)_3Al$ and $H_2O$ is typically near 0.1 nm/cycle or 1 Å/cycle at 300° C., or about 3-4 cycles/monolayer ($Al_2O_3$ has a bulk lattice parameter of about 3 Å). The methyl terminations left by each TMA pulse reduce the number of available chemisorption sites, such that less than a full monolayer forms with each pulse. The pulsing cycle is repeated sufficient times to produce the desired layer thickness. Aluminum oxide can be used as the gate dielectric, or as a thin layer prior to forming another dielectric layer.

In another arrangement, $ZrO_2$ is deposited by an ALD type process. $ZrCl_4$ vapor is introduced to the reaction chamber and exposed the wafer surface for 1.5 s. This is referred to as pulse A. The reaction chamber was purged with nitrogen gas for 3.0 s to remove surplus $ZrCl_4$ and byproducts from the reaction chamber. This is referred to as purge A. Then water vapor was introduced to the reaction chamber and exposed to the wafer surface for 3.0 s. This is referred to as pulse B. Residual $H_2O$ and reaction byproducts were removed by purging the reaction chamber for 4.0 s. This is referred to as purge B. During each of the reaction phases, the reactants are supplied in sufficient quantity for the given other parameters to saturate the surface.

This exemplary high-k deposition cycle is summarized in Table II.

TABLE II $ZrO_2$

| Phase | Reactant | Temperature (° C.) | Pressure (mbar) | Time (sec) |
|---|---|---|---|---|
| pulse A | $ZrCl_4$ | 300 | 5-10 | 1.5 |
| purge A | — | 300 | 5-10 | 3.0 |
| pulse B | $H_2O$ | 300 | 5-10 | 3.0 |
| purge B | — | 300 | 5-10 | 4.0 |

The cycle of Table II, consisting of pulse A, purge A, pulse B, purge B, was repeated 51 times. The average deposition rate is about 0.59 Å/cycle at 300° C., such that the $ZrO_2$ thickness was about 30 Å.

More generally, temperatures during an ALD process preferably fall between about 200° C. and 500° C., depending upon the acceptable level of chlorine incorporation into the layer. At higher temperatures, the chlorine content goes down. Too much chlorine can lead to charge trapping. At 300° C. chlorine content has been measured at about 0.5%. For an amorphous $ZrO_2$ layer, the temperature is more preferably at the low end of this range, between about 200° C. and 250° C., and most preferably at about 225° C. For a crystalline film, the temperature is more preferably at the high end of this range, between about 250° C. and 500° C., and most preferably about 300° C. As will be appreciated by the skilled artisan, however, mixtures of amorphous and crystalline composition result at the boundary of these two regimes. The illustrated process produces a largely crystalline $ZrO_2$ film.

In this case, the metal monolayer formed in the metal phase is self-terminated with chloride, which does not readily react with excess $ZrCl_4$ under the preferred conditions. The preferred oxygen source gas, however, reacts with or adsorbs upon the chloride-terminated surface during the oxygen phase in a ligand-exchange reaction limited by the supply of zirconium chloride complexes previously adsorbed. Moreover, oxidation leaves a hydroxyl and oxygen bridge termination that does not further react with excess oxidant in the saturative phase.

Preferably, sufficient cycles are conducted to grow between about 20 Å and 60 Å of $ZrO_2$. More preferably, sufficient cycles are conducted to grow between about 20 Å and 40 Å. The dielectric constant of the layer is between about 18 and 24. In the illustrated examples, 30 Å of $Zr_2O_3$ was formed.

An excited species treatment 125 follows dielectric formation 120. Whether the dielectric comprises conventional silicon oxide or a high k material (having a dielectric constant or k value greater than about 4), the excited species treatment 125 advantageously facilitates polysilicon or poly-SiGe nucleation over the dielectric surface. The invention can also have application to facilitating nucleation of SiGeC and silicon nitride or $Al_2O_3$ layers deposited over the high k material by CVD. The described treatment has also been found to have additional benefits in protecting the high k material and underlying substrate from degradation during subsequent processing, as will be described in more detail with respect to FIGS. 4A and 4B below.

Like the excited species treatment 110 preceding ALD, the treatment 125 preceding silicon or poly-SiGe deposition modifies the surface termination of the substrate to promote subsequent deposition. Advantageously, the treatment 125 is tuned such that the excited species impart sufficient activation energy to break the surface bonds and form new ones, while process parameters are tuned to maintain energy levels low enough to prevent etching of the substrate or significant diffusion of active species into the bulk material of the gate dielectric. Additionally, no appreciable deposition takes place. At the most, a monolayer of terminating tails is left by the excited species treatment 125. However, the process can be tuned to convert the topmost few monolayers of high k oxide to nitride by breaking metal-oxygen bonds and replacing them with metal-nitrogen bonds. Preferably, temperatures are kept between about room temperature and 800° C.

The excited species treatment 125 can be conducted in the same chamber as the preceding dielectric deposition 120, but is more preferably conducted in the same chamber as the subsequent electrode formation 130. Accordingly, temperatures during the treatment 125 are preferably matched with at least the initial stages of polysilicon or poly-SiGe deposition conditions, while other parameters (pressure, reactant concentration, plasma power, process duration) are optimized to have the desired surface modification with minimal bulk effects. In the illustrated embodiments, wherein subsequent electrode formation 130 comprises polysilicon or poly-SiGe deposition by CVD, temperatures during the treatment 125 are more preferably in the range of about 300° C. to 800° C., and most preferably from about 500° C. to 700° C.

In one embodiment, the excited species treatment 125 includes exposure to fluorine or chlorine radicals in sufficient supply to break surface bonds, but insufficient to etch the preferred high k surface. Sources gases provided to the preferred remote plasma generator 60 (FIG. 2) include $NF_3$, $F_2$, $B_2F_6$, $Cl_2$, $CF_4$, etc. Argon, helium or other inert gas can also flow to aid formation of glow discharge, but reaction chamber pressure is preferably kept below about 10 Torr for maintaining operation of the remote plasma unit.

Preferably, the process parameters are tuned to be sufficient for breaking surface bonds without significant bulk modification. In the case of in situ deposition 130 of the gate electrode, the substrate temperature is preferably set to match that desired for the subsequent deposition within the same chamber. For the given temperature, pressure, remote plasma power, process duration and reactant concentrations can be adjusted to for the desired surface conditioning.

In another embodiment, a nitrogen source, such as ammonia ($NH_3$) or nitrogen gas ($N_2$) can be supplied to the substrate to break surface bonds and create metal-nitrogen. $N_2$ is particularly preferred as the nitrogen source to minimize hydrogen content in the process. Argon, helium or other inert gas can also flow to aid formation of glow discharge, but reaction chamber pressure is preferably kept below about 10 Torr for maintaining operation of the remote plasma unit.

As noted, the process 125 does result in any significant deposition or increased thickness. Process parameters are preferably selected to replace metal-oxygen bonds in the upper few monolayers of the high k dielectric with metal-nitrogen bonds, forming a metal oxynitride. In particular, the excited species treatment 125 of the high k dielectric preferably converts less than about 10 Å of the dielectric surface to silicon oxynitride, more preferably forming about 2 Å to 5 Å on average. At the same time, energy levels in the process are maintained to avoid significant nitrogen diffusion into the bulk dielectric, beyond the nitrogen incorporation in the upper few monolayers of the dielectric. Preferably, the bulk dielectric contains less than about 10% atomic concentration of nitrogen at a depth of 10 Å.

Next, the gate electrode is deposited 130 over the treated gate dielectric, preferably in the same chamber as the prior surface treatment 125 and preferably in situ doped. The gate electrode preferably contains silicon and is CVD deposited. In the example described herein, the gate electrode comprises a CVD silicon germanium alloy, preferably having the form $Si_{1-x}Ge_x$, deposited by flowing a silicon source ($SiH_4$ in the illustrated example) and a germanium source (germane or $GeH_4$ in the illustrated example) over the treated gate dielectric. The prior remote plasma treatment 125, however, is also of benefit for other nucleation-sensitive deposition processes.

For simplicity, the silicon germanium layer will be referred to more generally as poly-SiGe. Preferably, the poly-SiGe deposition 130 immediately follows excited species surface treatment 125 within the same chamber. Alternatively, an initial silicon seed layer can be deposited prior to poly-SiGe. Preferably, either polysilicon or poly-SiGe deposition is conducted under atmospheric or near-atmospheric conditions.

As noted, the deposition of poly-SiGe preferably comprises flowing a silicon source gas, a germanium source gas and a carrier gas in a chemical vapor deposition process. In the illustrated embodiment, the silicon source gas comprises monosilane ($SiH_4$), the germanium source gas comprises dilute germane (1.5% $GeH_4$ in an inert gas), and the carrier gas comprises nitrogen ($N_2$). The silane flow can be between 50 sccm and 500 sccm, more preferably between about 100 sccm and 400 sccm. The dilute germane (1.5% germane in the illustrated embodiment) is preferably provided at a rate between 50 sccm and 5,000 sccm, more preferably between about 100 sccm and 1,000 sccm. The carrier flow is preferably between 5 slm and 50 slm, more preferably about 20 slm.

In the illustrated embodiment, without the aid of plasma or other supplemental energy sources, temperature during the deposition preferably is between about 500° C. and 800° C., more preferably between about 550° C. and 650° C., most preferably is at about 600° C. plus or minus 15° C. At the lower end of these ranges, poly-SiGe deposition is too slow for commercial applications. At the upper end of these ranges, on the other hand, germanium incorporation into the layer is reduced and surface roughness increases. For alternative silicon source gases, such as disilane and trisilane, the temperature for the deposition can be as low as 300° C., at least initially, with a preferred range of 500° C. to 700° C. Advantageously, such higher order silanes exhibit a lower hydrogen:

silicon ratio, and thus reduces risk of hydrogen diffusion through the surface and consequent reduction of the high k material to metal.

The poly-SiGe deposition is preferably conducted at greater than about 500 Torr, more preferably at greater than about 700 Torr, and is most preferably conducted at about atmospheric pressure (760 Torr). Slight pressure differentials due to gas flows are of negligible effect. As will be appreciated by the skilled artisan, atmospheric deposition reduces the efficiency with which precursors are converted to deposited poly-SiGe. However, the inventor has found deposition under atmospheric pressures to attain greater benefits to operational efficiency.

The germanium content in the poly-SiGe layer is preferably between about 10% and 80%, more preferably between about 20% and 50%. The overall thickness of the layer is preferably between 500 Å and 1,500 Å, and more preferably between about 500 Å and 1,000 Å.

An exemplary recipe for poly-SiGe deposition, using $H_2$ carrier gas, includes flow of about 500 sccm 1.5% germane, 100 sccm silane and 20 sim carrier gas at atmospheric pressure and 600° C. The skilled artisan will appreciate that the conditions should be separately optimized for performance with an $N_2$ carrier gas. Such flows produce a silicon germanium layer with a germanium content of between about 18% and 20%. With the same carrier and silane flow, 4,500 sccm dilute germane silane produces a germanium content of about 50%.

Poly-SiGe deposition 130 is most preferably followed by deposition of a cap layer. The cap layer preferably comprises silicon, and most preferably amorphous silicon. A relatively thin cap layer (e.g., about 100 Å) can be employed to minimize the risk of oxidizing germanium in the SiGe layer. On the other hand, the cap layer may also serve as a sacrificial layer for later silicidation, in accordance with many gate stack designs. In this case, the cap layer is thicker and is preferably between about 1,000 Å and 2,500 Å. The amorphous silicon cap can be followed by formation of a metal layer over the cap layer. This metal layer can then be annealed to react the overlying metal with the underlying silicon, in a standard silicidation reaction. While not illustrated, a dielectric cap layer can also be deposited over the conductive layers of the gate stack described above.

Once the gate stack has been completed, the gate electrodes are preferably patterned by conventional photolithographic techniques and etching. In other arrangements, the gate electrodes can be patterned prior to deposition of the metal layer, and the metal can be employed in a self-aligned silicidation, as is known in the art.

Having completed the gate stack, further processing to complete the integrated circuit follows. For example, gate stacks typically are insulated by blanket deposition of a dielectric and spacer etch. Transistor active areas are then doped to form source and drain regions to either side of the patterned electrodes, and wiring or "back end" processes complete the circuit.

Advantageously, the excited species treatments 110 (prior to ALD) and 125 (prior to poly-SiGe deposition) facilitates deposition over the treated surface. In the first example, the excited species treatment 110 facilitates adsorption of ALD reactants, and it will be appreciated that such benefit will attach in various other contexts where ALD is desired over a non-reactive substrate.

In the second example, surface treatment 125 enables rapid incubation and therefore faster deposition times for the overlying silicon-containing layer, such as the illustrated poly-SiGe layer, as well as better overall layer quality. Direct deposition of in situ germanium-doped silicon layers (without excited species treatment 125) tends to etch the underlying gate dielectric in competition with deposition, thus increasing incubation times. As will be appreciated by the skilled artisan, the increased incubation time and consequent increase in overall deposition time results in lower wafer throughput, which can mean the difference between commercially viable and non-viable processes in the highly competitive semiconductor fabrication industry. Furthermore, better incubation also entails a higher quality layer. The skilled artisan will appreciate, in view of the present disclosure, that undoped silicon or polysilicon in situ doped with phosphorus, arsenic or boron will also experienced improved incubation times.

Remote plasma nitridation of a high k dielectric top surface, prior to gate electrode formation, has been found to have additional benefits. In addition to improved nucleation of silicon-containing layers deposited thereover, the surface treatment has been found to also reduce degradation of the high k material during the subsequent deposition. The thin nitride or oxynitride formed by the excited species treatment is believed to inhibit reduction of the high k material. Such reduction, which would leave conductive metal in place of metal oxide, can otherwise result from the gate electrode deposition, particularly where the deposition recipe employs a high hydrogen content and/or high temperatures. Furthermore, oxygen diffusion through the high k layer can also be inhibited by the minimal nitridization effected by the preferred excited species treatments 110, 125.

Figure 4A:
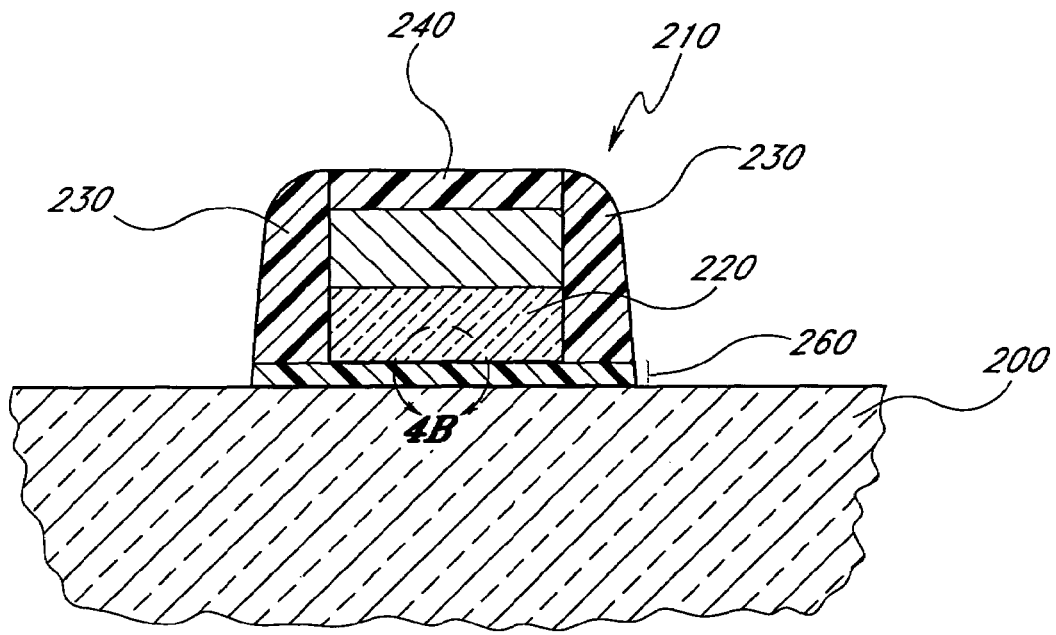
FIGS. 4A and 4B are schematic sections of a transistor gate stack constructed in accordance with preferred embodiments of the invention.
Figure 4B:
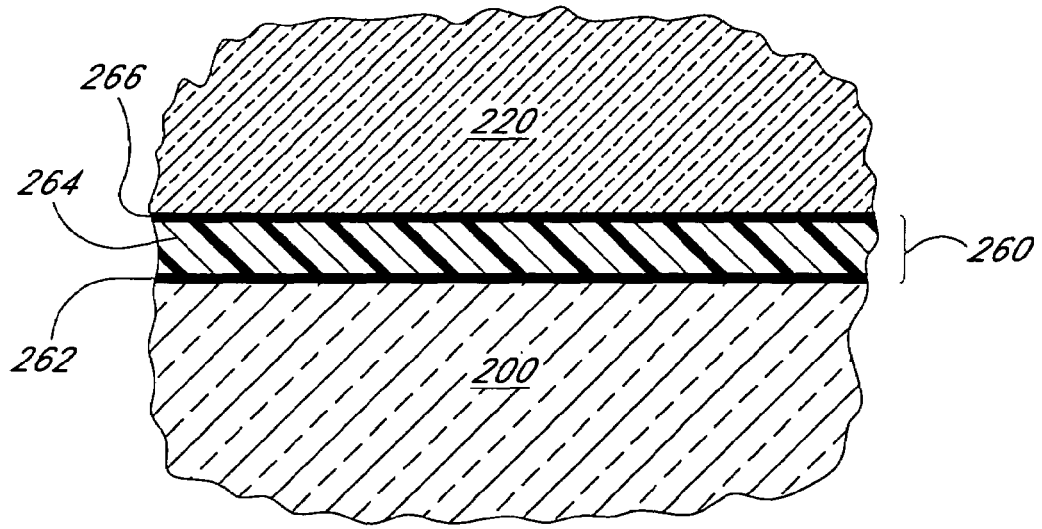
Figure 5:
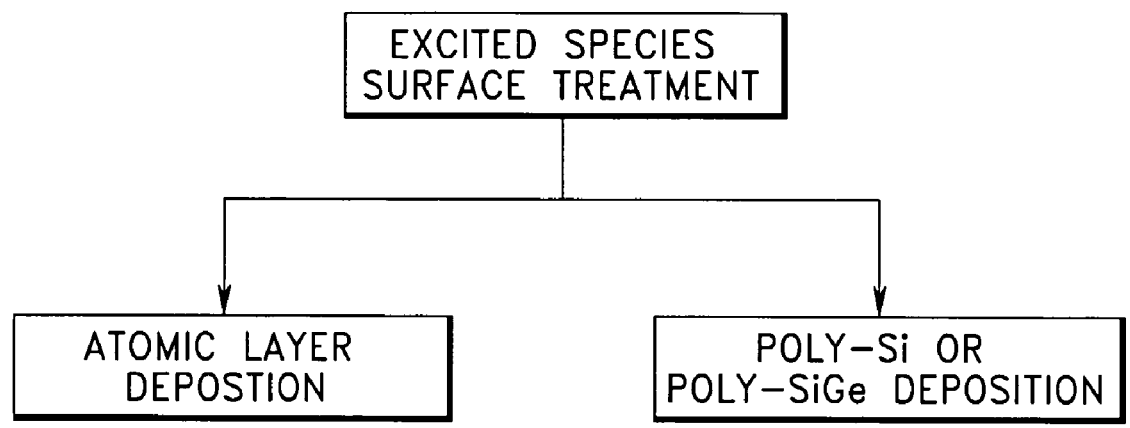
FIG. 5 is a flow chart illustrating the sequence for two embodiments of the invention.

FIGS. 4A and 4B illustrate a transistor gate incorporating such a dielectric stack. In particular, a semiconductor substrate 200 is shown with a transistor gate stack 210 formed thereover. In the illustrated embodiment, the substrate 200 comprises an upper portion of a single-crystal silicon wafer, though the skilled artisan will appreciate that the substrate can also comprise other semiconductor materials.

The gate stack 210 includes a poly-SiGe electrode layer 220, with sidewall spacers 230 and an insulating layer 240 protecting and isolating the electrode 220 in a conventional manner. Also illustrated is a more highly conductive strapping layer 250, typically including metal, over the poly-SiGe 220. The strap 250 facilitates rapid signal propagation among transistor gates across the wafer, connecting the gates to logic circuits. In other arrangements, the gate electrode may comprise an in situ doped polysilicon layer.

A gate dielectric 260, formed by the exemplary processes described above, separates the gate electrode 220 from the substrate 200. As noted in the Background section above, the gate dielectric 260 is a critical feature in the pursuit of denser and faster circuits.

As best seen from the enlarged view of FIG. 4B, the preferred gate dielectric 260 includes an interface 262 with the underlying substrate 200, a bulk dielectric layer 264, and an interface 266 with the overlying gate electrode 220. The interfaces 262, 266 of the illustrated embodiment do not represent deposited layers; rather, the interfaces have been slightly modified prior to the deposition of the layer thereover. In other arrangements, the plasma treatments could leave additional layers. In the illustrated embodiments, a remote plasma provides radicals for modifying the first interface 262 immediately prior to ALD, where the surface modification facilitates adsorption of ALD reactants. A remote plasma also provide radicals for modifying the second interface 266 immediately prior to in situ deposition of silicon-containing layers, such as polysilicon, and particularly intrinsic polysilicon and poly-SiGe deposition by CVD, where the surface modification facilitates nucleation of poly-SiGe. In the case of remote plasma nitridation, the lower interface 262 comprises a nitridized portion of the substrate 200 preferably extending less than about 10 Å into the substrate 200, more preferably comprising about 3 Å to 5 Å. Preferably the bulk substrate underneath this interface 262 contains less than about 1 atomic % nitrogen. The upper interface 266 similarly preferably exhibits a low percentage of nitrogen (preferably less than 10 atomic %) at a distance of 10 Å below the gate electrode 220.

In one embodiment, a transistor gate stack is formed by first forming a gate dielectric over a semiconductor substrate. The gate dielectric is then exposed to a source of nitrogen excited species. This exposure causes less than about 10 atomic % nitrogen at a depth of greater than about 10 Å from an upper surface of the gate dielectric to be incorporated into the gate dielectric. A silicon-containing gate electrode is then deposited over the gate dielectric.

It will be appreciated by those skilled in the art that various omissions, additions and modifications may be made to the processes described above without departing from the scope of the invention, and all such modifications and changes are intended to fall within the scope of the invention, as defined by the appended claims. For example, while illustrated in the context of surface treatment prior to ALD and CVD, the skilled artisan may also find application for radical treatment of surfaces prior to other forms of deposition, including but not limited to MOCVD and JVD.

We claim:

1. A method comprising:
   forming a layer of dielectric material over a substrate;
   exposing the layer of dielectric material to a source of nitrogen excited species, wherein exposing incorporates less than about 10 atomic percent nitrogen at a depth of greater than about 10 Å from an upper surface of the layer of dielectric material; and
   depositing a conductor over the layer of dielectric material after exposing the layer of dielectric material to the source of nitrogen excited species, wherein the conductor contacts a portion of the layer of dielectric material exposed to the source of nitrogen excited species.

2. The method of claim 1, wherein the substrate is electrically conductive.

3. The method of claim 1, wherein the layer of dielectric material is a transistor gate dielectric layer.

4. The method of claim 1, wherein the layer of dielectric material has a dielectric constant of greater than about 4.

5. The method of claim 1, wherein exposing incorporates less than about 1 atomic percent nitrogen at a depth of greater than about 10 Å from the surface.

6. The method of claim 1, wherein the layer of dielectric material comprises a material selected from the group consisting of aluminum oxide, zirconium oxide, hafnium oxide, tantalum oxide, barium strontium titanate and strontium bismuth tantalate.

7. The method of claim 6, wherein the layer of dielectric material comprises zirconium oxide.

8. The method of claim 1, wherein forming the layer of dielectric material comprises an atomic layer deposition.

9. The method of claim 1, wherein depositing the conductor comprises a chemical vapor deposition.

\* \* \* \* \*